(12) United States Patent
Liu et al.

(10) Patent No.: US 9,343,874 B2
(45) Date of Patent: May 17, 2016

(54) SEMICONDUCTOR DEVICE AND FABRICATION METHOD

(71) Applicant: UCL BUSINESS PLC, London (GB)

(72) Inventors: Huiyun Liu, London (GB); Andrew David Lee, London (GB); Alwyn John Seeds, London (GB)

(73) Assignee: UCL BUSINESS PLC, London (GB)

( * ) Notice: Subject to any disclaimer, the term of this patent is extended or adjusted under 35 U.S.C. 154(b) by 0 days.

(21) Appl. No.: 14/418,399

(22) PCT Filed: Jul. 30, 2013

(86) PCT No.: PCT/GB2013/052034
§ 371 (c)(1),
(2) Date: Jan. 29, 2015

(87) PCT Pub. No.: WO2014/020329
PCT Pub. Date: Feb. 6, 2014

(65) Prior Publication Data
US 2015/0244151 A1  Aug. 27, 2015

(30) Foreign Application Priority Data

Aug. 1, 2012 (GB) .................................. 1213673.5

(51) Int. Cl.
*H01S 5/00* (2006.01)
*H01S 5/34* (2006.01)
(Continued)

(52) U.S. Cl.
CPC ............... *H01S 5/3412* (2013.01); *B82Y 20/00* (2013.01); *H01L 21/02381* (2013.01); *H01L 21/02433* (2013.01); *H01L 21/02463* (2013.01); *H01L 21/02507* (2013.01); *H01L 21/02538* (2013.01);
(Continued)

(58) Field of Classification Search
CPC ........ H01S 5/02; H01S 5/3013; H01S 5/2018; H01S 5/3406; H01S 5/3403; H01S 5/34; H01S 5/343
USPC ............................................ 372/44.06, 43.01
See application file for complete search history.

(56) References Cited

U.S. PATENT DOCUMENTS 4,291,327 A      9/1981  Tsang
5,399,522 A  *   3/1995  Ohori ............................ 438/493
(Continued)

FOREIGN PATENT DOCUMENTS

EP   0 450 228    10/1991
JP   06-077582    3/1994
(Continued)

OTHER PUBLICATIONS

Harris et al; Fabrication and characterization of 100-nm-thick GaAs cantilevers; Rev. Sci. Instrum. 67(10), pp. 3591-3593, Oct. 1996.
(Continued)

*Primary Examiner* — Kinam Park
(74) *Attorney, Agent, or Firm* — Foley & Lardner LLP

(57) ABSTRACT

A semiconductor device comprising a silicon substrate on which is grown a <100 nm thick epilayer of AlAs or related compound, followed by a compound semiconductor other than GaN buffer layer. Further III-V compound semiconductor structures can be epitaxially grown on top. The AlAs epilayer reduces the formation and propagation of defects from the interface with the silicon, and so can improve the performance of an active structure grown on top.

18 Claims, 4 Drawing Sheets

Figure 1:
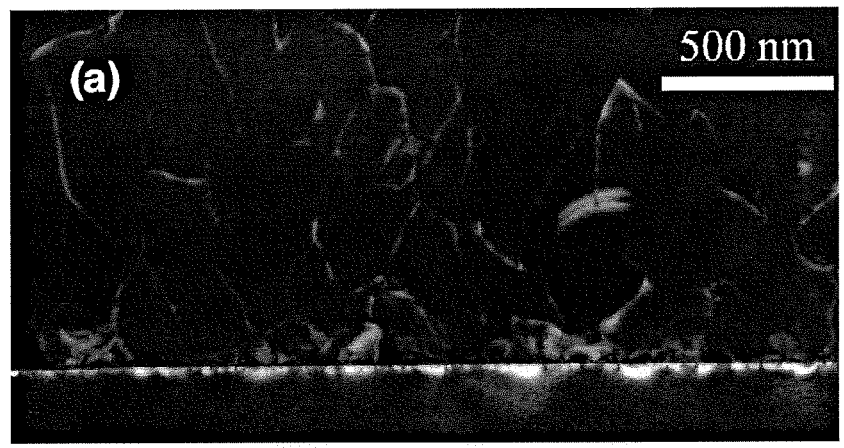
Figure 1:
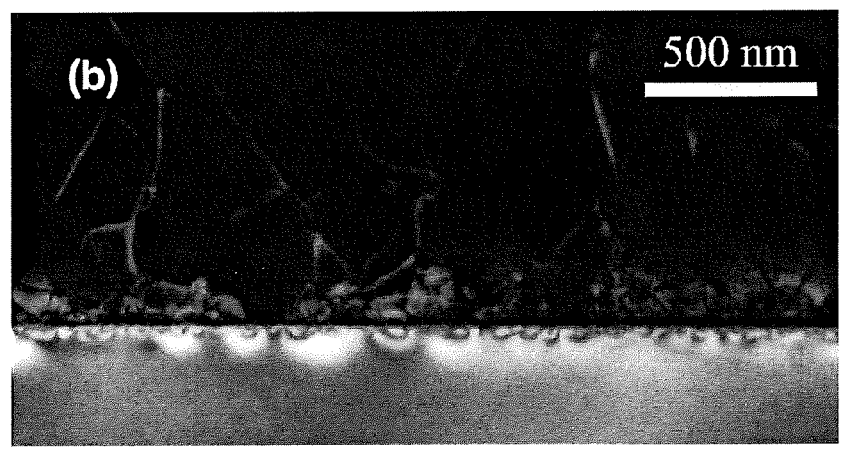

(51) Int. Cl.
H01S 5/02 (2006.01)
H01S 5/30 (2006.01)
H01S 5/20 (2006.01)
H01S 5/343 (2006.01)
H01L 21/02 (2006.01)
B82Y 20/00 (2011.01)

(52) U.S. Cl.
CPC .... *H01L 21/02549* (2013.01); *H01L 21/02661* (2013.01); *H01S 5/02* (2013.01); *H01S 5/021* (2013.01); *H01S 5/2018* (2013.01); *H01S 5/3013* (2013.01); *H01S 5/34* (2013.01); *H01S 5/343* (2013.01); *H01S 5/3403* (2013.01); *H01S 5/3406* (2013.01); *H01S 5/34313* (2013.01)

(56) References Cited

U.S. PATENT DOCUMENTS

| 7,590,159 | B2* | 9/2009 | Jikutani et al. | 372/50.11 |
| 2001/0023942 | A1 | 9/2001 | Kim et al. | |
| 2001/0042503 | A1* | 11/2001 | Lo et al. | 117/4 |
| 2010/0258845 | A1 | 10/2010 | Marui et al. | |
| 2011/0006282 | A1 | 1/2011 | Hatori et al. | |
| 2011/0073913 | A1 | 3/2011 | Puetz et al. | |
| 2012/0125418 | A1* | 5/2012 | Puetz et al. | 136/255 |
| 2014/0016659 | A1* | 1/2014 | Liu et al. | 372/45.012 |

FOREIGN PATENT DOCUMENTS

| JP | 11-297628 | 10/1999 |
| JP | 2004-335665 | 11/2004 |
| WO | WO-00/48239 | 8/2000 |
| WO | WO-2012/114074 | 8/2012 |

OTHER PUBLICATIONS

Lee A D et al: A room temperature electrically pumped 1.3-um InAs quantum dot laser monolithically grown on silicon substrates; 8th IEE International Conference on Group IV Photonics (GFP), 2011.

Strittmatter et al: Low-pressure metal organic chemical vapour deposition of GaN on silicon(111) substrates using an AlAs nucleation layer; Appl. Phys. Lett. 74, 1242 (1999).

* cited by examiner

FIGURE 4

| p⁺ -GaAs contact layer |
|---|
| p-AlGaAs cladding layer |
| GaAs/AlGaAs waveguide layer |
| 5-layer InAs/InGaAs DWELL |
| GaAs/AlGaAs waveguide layer |
| n-AlGaAs cladding layer |
| III–V buffer layer |
| 5 nm AlAs nucleation layer |
| Si-substrate |

SEMICONDUCTOR DEVICE AND FABRICATION METHOD

CROSS REFERENCE TO RELATED PATENT APPLICATIONS

This application is a U.S. national stage application under 35 U.S.C. §371 claiming the benefit of International Patent Application No. PCT/GB2013/052034, filed Jul. 30, 2013, which claims priority to GB Patent Application No. 1213673.5, filed Aug. 1, 2012, the entire contents of each of which are incorporated herein by reference in their respective entireties.

The present invention relates to a semiconductor device and method of fabrication thereof, in particular relating to III-V compounds grown on silicon.

The realisation of semiconductor laser diodes on a Si platform will enable the fabrication of complex optoelectronic circuits, which will permit the creation of the long-dreamed of chip-to-chip and system-to-system optical communications. Although in the last 30 years great effort has been devoted to Si-based light generation and modulation technologies, lasers on Si substrates are still considered to be the holy grail of Si photonics, because they represent one of the greatest challenges to be realised among all Si photonics components and have massive potential for applications if successful. Due to the indirect band structure of Si and Ge, radiative recombination processes for Ge and Si emitters are insignificant compared to non-radiative recombination. Direct bandgap III-V compounds have robust photonic properties for semiconductor emitters in a wide range of photonic applications. Direct epitaxial growth of III-V compound semiconductor materials, such as GaAs on Si substrates is one of the most promising candidates for the fabrication of electrically pumped lasing sources on a Si platform, because of its potential for the realisation of photonic integrated circuits by combining the optoelectronic properties of III-V with Si very large scale integrated (VLSI) microelectronic technology. The heteroepitaxial technology could also provide III-V compound semiconductor photonic circuits with large-area, low-cost and lightweight substrates with high mechanical strength and high thermal conductivity which can accommodate associated electronic functions.

The most severe problem remaining to be solved in the monolithic integration of GaAs on Si substrate is the introduction of high-density threading dislocations (TDs) in the III-V active region, despite research stretching back over 30 years. The TDs are nucleated at the interface between the GaAs buffer layer and Si subtrate, due to the lattice-mismatch between GaAs and Si. Some of the TDs propagate into the III-V epitaxy layers built on GaAs/Si, leading to reduced optoelectronic conversion efficiency and lifetime for GaAs devices epitaxially grown on Si substrates. Reducing the defect density within the GaAs buffer layer on Si substrates is critical for successful integration of GaAs-based photonic components with Si microelectronic circuits. Moreover, recent studies have shown that III-V nanosized crystals—quantum dots (QDs)—are a better alternative to quantum wells for building III-V lasing devices on a Si platform due to their unique advantages, such as lower threshold current density ($J_{th}$), temperature-insensitive operation above room temperature (RT), and lower sensitivity to defects.

The present invention seeks to alleviate, at least partially, some or any of the above problems.

According to one aspect of the present invention, there is provided a semiconductor device comprising:

a silicon substrate;
an epilayer formed on the substrate; and
at least one layer of III-V compound, other than GaN, on the epilayer,
wherein the epilayer comprises a compound of the formula:

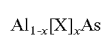

$$Al_{1-x}[X]_xAs$$

wherein:
X is at least one group III element other than Al;
x is greater than or equal to 0; and
x is less than or equal to 0.5.

According to another aspect of the present invention, there is provided a method of fabricating a semiconductor device comprising:

providing a silicon substrate;
epitaxially growing an epilayer on the substrate; and
epitaxially growing at least one layer of III-V compound, other than GaN, on the epilayer,
wherein the epilayer comprises a compound of the formula:

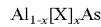

$$Al_{1-x}[X]_xAs$$

wherein:
X is at least one group III element other than Al;
x is greater than or equal to 0; and
x is less than or equal to 0.5.

Figure 2:
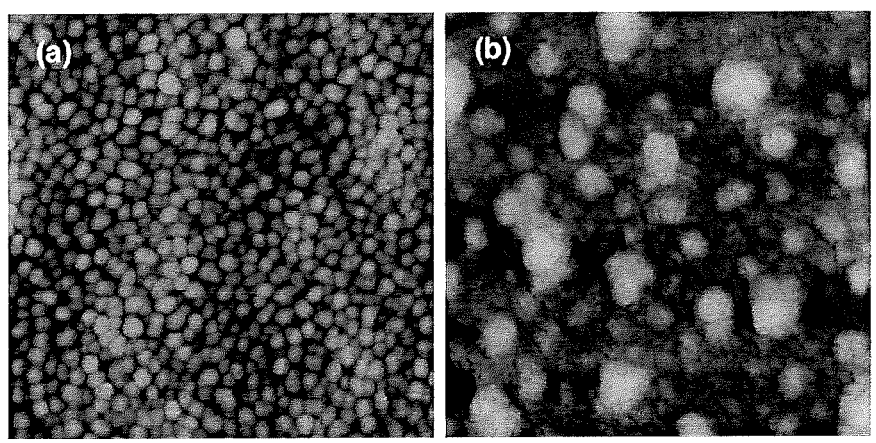
Figure 3:
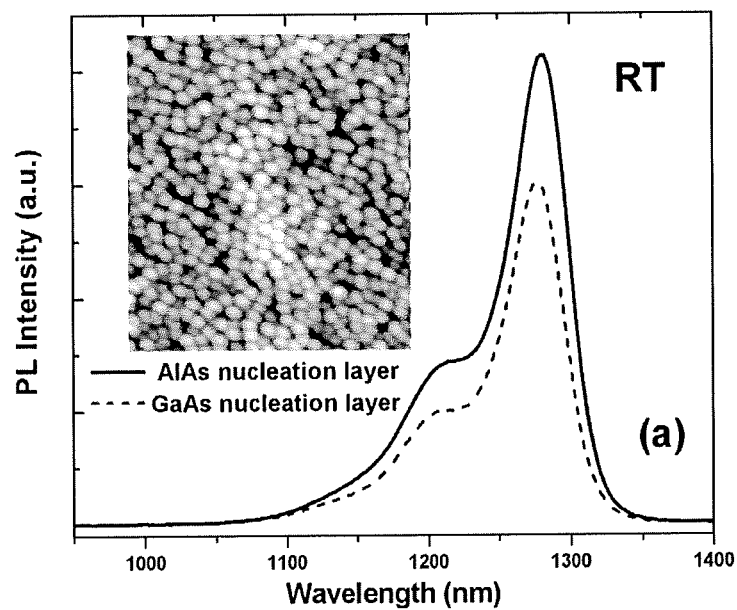
Figure 3:
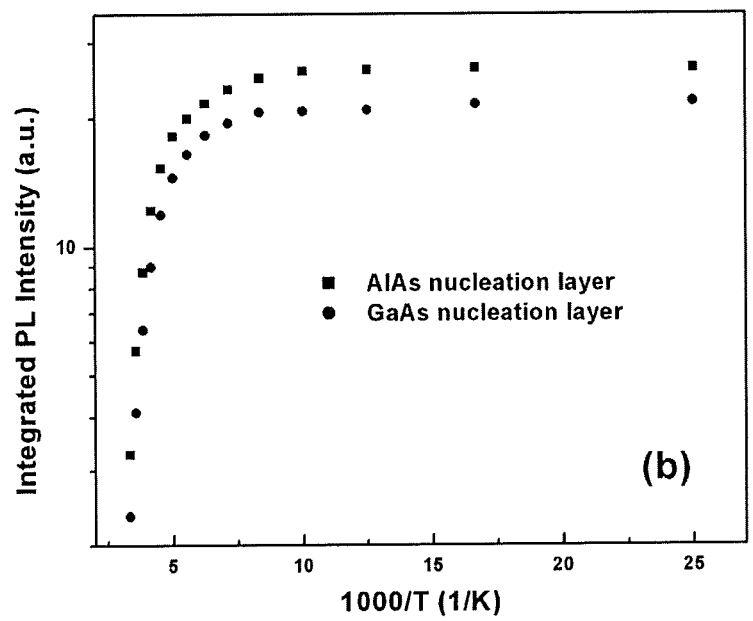
Figure 5:
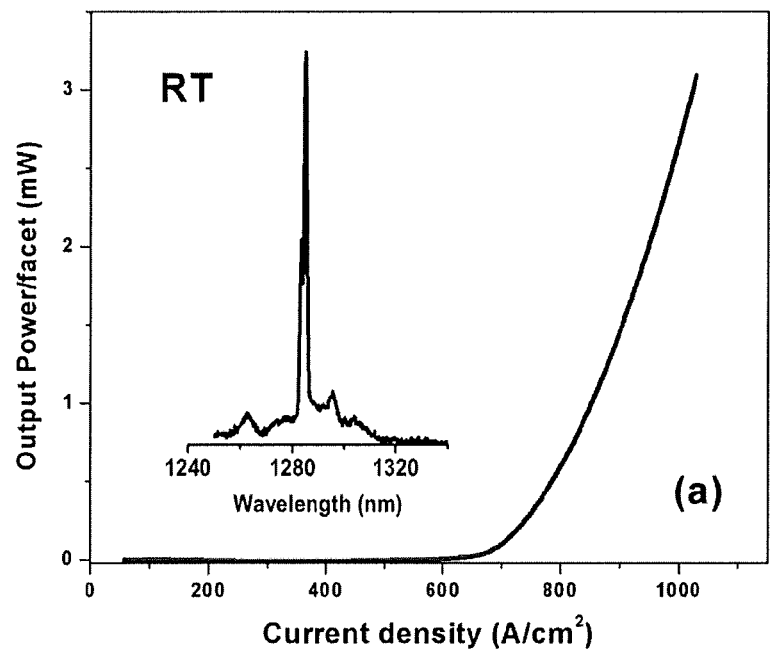
Figure 5:
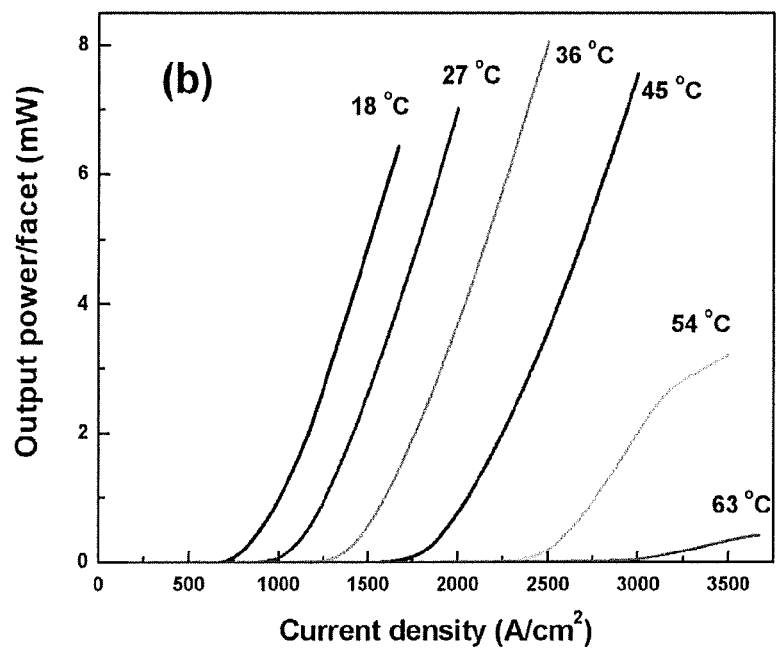

Embodiments of the invention will now be described, by way of example only, with reference to the accompanying drawings in which:

FIGS. 1(a) and 1(b) are cross-sectional TEM images of the GaAs/Si interface region with (a) the GaAs nucleation layer as a comparative example and (b) the AlAs nucleation layer according to an embodiment of the invention, respectively;

FIGS. 2(a) and 2(b) show AFM (atomic force microscope) images of the surface morphology of (a) a 5 nm GaAs nucleation layer as a comparative example and (b) a 5 nm AlAs nucleation layer according to an embodiment of the invention, respectively;

FIG. 3(a) shows photoluminescence spectra, and an inset AFM image, for quantum dot structures, and FIG. 3(b) shows Arrhenius plots of the temperature dependence of integrated photoluminescence intensity for the quantum dot structure;

FIG. 4 illustrates schematically the layer structure for an InAs quantum-dot laser diode; and FIGS. 5(a) and 5(b) show plots of light output power against current for quantum dot laser diodes, with 5(a) being at room temperature and 5(b) showing results for a range of substrate temperatures, the inset to 5(a) shows the laser optical spectrum above threshold current at room temperature.

In one exemplary embodiment of the present invention, an AlAs layer is introduced for the epitaxial growth of a GaAs buffer layer on an Si substrate. The AlAs layer is also referred to herein as a nucleation layer (NL) or simply as an epilayer because it is epitaxially grown on the substrate. All the samples were grown on phosphorus-doped (100)-oriented Si substrates with 4° offcut toward the planes by solid-source molecular beam epitaxy although other orientations could be used. III-V buffer layers on Si substrates were initiated with either a 5-nm AlAs NL or a 5-nm GaAs NL (as a comparative example), followed by a 1-µm GaAs buffer layer. The use of an AlAs NL enables more defects to be confined in the interface between the III-V epitaxial layer and the Si substrate in order to relax the strain, and also less defects to propagate into the III-V active region, leading to an increase in the RT photoluminescence intensity for Si-based InAs/GaAs QDs. A 5-layer InAs/InGaAs dot-in-a-well (DWELL) laser structure on a Si substrate was fabricated with the use of an AlAs NL. RT lasing occurs at ~1.29 µm with $J_{th}$ of 650 A/cm², which is lower than previously reported values for Si-based InGaAs QD lasers with a GaAs NL.

The structural properties of the buffer layer for the sample with the AlAs NL are compared with those with the GaAs NL using transmission electron microscope (TEM), atomic force microscope (AFM), and etch-pit density (EPD) measurements. FIG. 1 shows the TEM images of the III-V/Si interface for the samples with the AlAs NL (FIG. 1(b)) and with the GaAs NL (FIG. 1(a)). The defects are generated at the III-V/Si interface due to the mismatch between Ga(Al)As and Si, as shown in both images of FIG. 1. While most defects are well confined in the interface region, some of the TDs propagate into the GaAs buffer layers for both samples. In comparison with the sample with the GaAs NL (FIG. 1(a)), the sample with the AlAs NL has more defects confined in the interface region with less defects propagating into the GaAs buffer (FIG. 1(b)). This result clearly suggests that the mechanism of defect formation and propagation for the AlAs NL on a Si substrate is different from that for the GaAs NL. To understand the effects of the AlAs NL, AFM measurements were performed to study the morphologies of both the AlAs and GaAs NLs. For the AFM measurements, the growth was terminated immediately after the deposition of a 5-nm AlAs layer or a 5-nm GaAs layer on Si substrates, followed by sample cool-down. The 1 µm×1 µm AFM images for the samples with the GaAs NL and the AlAs NL are shown in FIGS. 2(a) and 2(b), respectively. For the sample with the GaAs NL, GaAs dots are observed with a density of over $5 \times 10^{10}/cm^2$ (FIG. 2(a)). The height and width of the GaAs dots are about 4 nm and 20 nm, respectively. These indicate that the strain energy of 5-nm GaAs NL grown on a Si substrate is relaxed by the formation of coherent islands, which is similar to the In(Ga)As/GaAs system. The increase in strain by further depositing GaAs will eventually lead to the coalescence of coherent GaAs dots, and hence the formation of TDs propagating within the GaAs buffer layers, as observed in the In(Ga)As/GaAs system. In contrast, a lower density of $4 \times 10^9/cm^2$ was obtained for AlAs dots grown on a Si substrate, with an irregular shape and larger average height and width of about 20 nm and 80 nm (FIG. 2(b)). The shape and size of AlAs dots indicate that the AlAs dots are defective. This suggests that the strain energy of 5-nm AlAs NL grown on a Si substrate is relaxed by the formation of both defects at the AlAs/Si interface and defective AlAs dots. Therefore, in comparison with the sample with the GaAs NL, more defects are confined at the III-V/Si interface and less defects propagating into the GaAs buffer layer are observed for the sample with the AlAs NL, as observed in FIG. 1. The defect density in the III-V active region was estimated by EPD tests for both the sample with the AlAs NL and the one with the GaAs NL. The etchant used for the EPD delineation is a mixture of $H_3PO_4$, $H_2O_2$, and $H_2O$ (in a 1:1:3 ratio). The defect densities of $3 \times 10^6/cm^2$ and $6 \times 10^6/cm^2$ were obtained for the samples with the AlAs NL and the one with the GaAs NL, respectively.

Next, an InAs/InGaAs dot-in-a-well (DWELL) structure was fabricated on the III-V buffer layers with the use of AlAs or GaAs NLs. III-V buffer layers consist of the following layer sequence: AlAs NL, GaAs buffer layer, InGaAs/GaAs dislocation filter layer, and GaAs/AlGaAs superlattice layers, and are described in the detailed methods section. The inset of FIG. 3(a) shows the 1×1 µm² AFM image of the uncapped InAs QDs for the sample with the AlAs NL, from which a QD density of about $4.3 \times 10^{10}$ cm⁻² is obtained. The main part of FIG. 3(a) shows the RT photoluminescence (PL) spectra of InAs/GaAs QDs on Si substrates with the GaAs and AlAs NL, respectively. The InAs/GaAs QDs yield a RT emission at ~1.29 µm with a full width at half maximum (FWHM) of ~30 meV for both of the samples shown in FIG. 3(a). Of considerable significance is that the RT integrated PL intensity (IPLI) of the sample with the AlAs NL is about 40% higher than that with the GaAs NL. It should be mentioned that the sample with the GaAs NL was grown under the same optimised growth conditions as the QD laser diode which led to the first electrically pumped 1.3-µm InAs/GaAs QD laser monolithically grown on Si substrates. The IPLI over the temperature range 10-300 K was studied for these two samples, as shown in FIG. 3(b). Thermal activation energies of about 260 meV are indicated by the slopes of the lines at high temperatures for both of the samples, and are close to the energy difference between the QD ground state and the InGaAs quantum well in the InAs/InGaAs DWELL structure (such as ~290 meV). In general, the reduction in the IPLIs of InAs/GaAs QDs at high temperature (>200 K) is attributed to the thermal escape of carriers from InAs QD ground states into InGaAs QWs followed by non-radiative recombination in the barriers. Therefore, the enhancement of IPLI for the sample with the AlAs NL could be understood as the reduced density of TDs propagating into the InAs/InGaAs DWELL region, as confirmed by the TEM results shown in FIG. 1 and EPD measurements.

Si-based InAs/GaAs QD laser diodes were investigated with the incorporation of the AlAs NL. The laser structure was grown on a phosphorus-doped Si substrate and is illustrated in FIG. 4. III-V buffer layers are the same as those used for studying the effects of the AlAs NL. The 5-layer InAs/InGaAs DWELL active region was grown at the center of an undoped 150-nm GaAs/AlGaAs waveguide layer with an n-type lower and a p-type upper cladding layer consisting of 1.5-µm AlGaAs. A 300-nm p⁺-GaAs contact layer completed the growth. Broad-area laser diodes, with a width of 50 µm, were fabricated by standard photolithography, wet etching, and metallisation techniques. Laser characteristics were measured in pulsed mode using a pulse width of 0.1 µs and duty cycle of 0.01%. The output spectrum at the above threshold current is shown in the inset of FIG. 5(a), demonstrating RT lasing at 1.286 µm. The main part of FIG. 5(a) shows the RT light output against drive current (L-I) characteristic for the device with a cavity length of 3.5 mm. The RT $J_{th}$ is about 650 A/cm², which is much lower than previously reported values of III-V QD lasers monolithically grown on Si substrates, such as 900 A/cm² for a 1.02-µm QD device and 725 A/cm² for a 1.3-µm QD laser. FIG. 5(b) shows L-I curves for a device with 3-mm length at various temperatures. This QD laser has a 63° C. maximum lasing temperature with a characteristic temperature $T_0$ of ~40K between 18 and 63° C., which is comparable to the values of 1.3-µm InAs/GaAs QD lasers grown on GaAs substrates.

These results have demonstrated the use of an AlAs nucleation layer on Si substrates to reduce the density of threading dislocations, generated at the III-V/Si interface, propagating into the InAs/GaAs QD active region, and hence increases in the RT PL intensity of 1.3-µm InAs/GaAs QDs grown on it. By incorporating the AlAs nucleation layer, RT lasing at 1.29 µm has been demonstrated for InAs/GaAs QD lasers monolithically grown on Si substrates with RT $J_{th}$ of 650 A/cm² and operation up to 63° C., values which are better than conventional values for 1.3-µm InAs/GaAs QD devices monolithically grown on Si substrates with a GaAs nucleation layer.

Detailed Methods

Crystal Growth:

The epitaxial materials were fabricated by solid-source III-V molecular beam epitaxy. InAs/GaAs QD samples were grown on phosphorus-doped (100)-oriented Si substrates with a 4° offcut toward the planes. The oxide desorption was performed by holding the Si substrate at a temperature of 900° C. for 10 minutes. The Si substrate was then cooled down to 400° C. for the growth of a 5-nm GaAs or an 5-nm AlAs NL, and a further 25 nm GaAs layer, followed by a 1-μm thick GaAs buffer layer grown at high temperature. Multilayer InGaAs/GaAs dislocation filter layers, consisting of two repeats of a five-period (10-nm $In_{0.15}Ga_{0.85}As$/10-nm GaAs) superlattices (SPL) and 350-nm GaAs, were deposited on the GaAs buffer layer. Finally 160-nm SPL layers of alternating 2-nm Ga/As/2-nm $Al_{0.4}Ga_{0.6}As$ layer completed the III-V buffer layers. A five-layer InAs/InGaAs dot-in-a-well (DWELL) structure was then grown at optimised conditions as on GaAs substrates, with each layer consisting of 3.0 MLs of InAs grown on 2 nm of $In_{0.15}Ga_{0.85}As$ and capped by 6 nm of $In_{0.15}Ga_{0.85}As$ at ~510° C. 45-nm GaAs barriers separated the five DWELLs. The InAs/GaAs DWELL structure was then embedded between 100-nm GaAs layer grown at 580° C. for GaAs, which was further confined by two 50-nm AlGaAs layers grown at 600° C. to prevent the photogenerated charge carriers from migrating to the substrate or surface at high temperatures.

Measurements:

AFM measurements were performed with a Nanoscope Dimension™ 3100 SPM AFM system in ambient conditions using a noncontact mode. Photoluminescence measurements were performed in a close-cycle He cryostat under 532 nm excitation from a diode-pumped solid-state laser. The PL spectra were dispersed by a 0.25 m monochromator and detected by a TE-cooled Ge detector. Temperature dependent PL measurements were taken from 10 to 300 K at a laser power of 30 mW.

OTHER EMBODIMENTS

Although an AlAs NL has been described above, there may be a proportion of other elements present in the NL, such as Ga or In, either in residual amounts or, for example in compounds of the form $Al_{1-x}[X]_xAs$, where X is one or more group III element other than Al, x is less than or equal to 0.5, and x is greater than or equal to 0. A specific example would be where X is Ga. In one example x is 0.25, so the NL compound is $Al_{0.75}Ga_{0.25}As$.

The mean thickness of the epilayer (forming the nucleation layer NL) is preferably less than 100 nm, and more preferably less than 20 nm, because the benefit of confining defects at the Si interface can decline at larger mean thicknesses. Examples of preferred mean thicknesses are 2.5 nm, 5 nm and 10 nm.

In the earlier described embodiments of the invention, the layer that is grown on top of the NL epilayer is GaAs. However, any suitable III-V compound could be used, such as InP, GaSb, GaAs or mixtures of the elements in these compounds. GaN is excluded from the possible III-V compounds because it has a wurtzite crystal structure, so is generally not compatible with the epilayer which is typically of the zinc blende crystal structure. In contrast, GaAs has a zinc blende crystal structure and a similar lattice constant to AlAs, so the AlAs nucleation layer (epilayer) has close crystallographic properties to GaAs and specifically mitigates the presence of defects at the interface; consequently, active photonic structures grown on top can have enhanced properties.

The term "III-V compound" and similar expressions used herein is not limited to binary compounds, but can include compounds with multiple group III elements and/or multiple group V elements.

The invention is not limited to a quantum dot laser on a Si substrate, but could be used for other general semiconductor structures, for example detectors, modulators or other III-V photonic devices on a Si substrate. III-V electronic devices, such as diodes and transistors could also be fabricated with the use of this invention. Applications include, but are not limited to, chip optical inter-connects, solar cells, optical fibre communications (light emitters and detectors).

In a method embodying the present invention, the epilayer (NL) can be grown at a relatively low temperature, because it is relatively thin. This can be advantageous in lowering the quality of any interfacial defects. Preferably, it is grown at a temperature below 500° C. A suitable temperature range is from 300° C. to 500° C., and is exemplified in the description above at 400° C.

In the detailed method described above, the crystal growth is by molecular beam epitaxy (MBE), but it could also be done by chemical vapour deposition (CVD).

Semiconductor devices and fabrication methods have been described above with reference to various specific embodiments and examples. However, it is to be understood that the claims below are in no way limited to these specific embodiments and examples.

The invention claimed is:

1. A semiconductor device comprising:
   a silicon substrate;
   an epilayer formed on the silicon substrate; and
   at least one layer of III-V compound directly on the epilayer,
   wherein the epilayer comprises a compound of the formula:

$Al_{1-x}[X]_xAs$ wherein:
   X is at least one group III element other than Al;
   x is greater than or equal to 0; and
   x is less than or equal to 0.5,
   wherein the at least one layer of III-V compound directly on the epilayer is one of a GaAs layer, an InP layer or a GaSb layer.

2. The semiconductor device of claim 1, wherein the mean thickness of the epilayer is less than 100 nm.

3. The semiconductor device of claim 1, wherein the mean thickness of the epilayer is less than 20 nm.

4. The semiconductor device of claim 1, wherein the mean thickness of the epilayer is less than 10 nm.

5. The semiconductor device of claim 1, wherein X is Ga.

6. The semiconductor device of claim 1, wherein the epilayer is AlAs.

7. The semiconductor device of claim 1, wherein the at least one layer of III-V compound has a zinc blende crystal structure.

8. A quantum dot laser comprising:
   a semiconductor device comprising:
      a silicon substrate;
      an epilayer formed on the silicon substrate; and
      at least one layer of III-V compound directly on the epilayer,
      wherein the epilayer comprises a compound of the formula:

$Al_{1-x}[X]_xAs$ wherein:
X is at least one group III element other than Al;
x is greater than or equal to 0; and
x is less than or equal to 0.5
wherein the at least one layer of III-V compound directly on the epilayer is one of a GaAs layer, an InP layer or a GaSb layer.

9. The quantum dot laser of claim 8, wherein a lasing wavelength of the quantum dot laser is in the range of from 1250 nm to 1350 nm.

10. The quantum dot laser of claim 8, comprising InAs/GaAs quantum dot structures.

11. A method of fabricating a semiconductor device comprising:
providing a silicon substrate;
epitaxially growing an epilayer on the silicon substrate; and
epitaxially growing at least one layer of III-V compound on the epilayer, wherein the at least one layer of III-V compound is one of a GaAs layer, an InP layer or a GaSb layer;
wherein the epilayer comprises a compound of the formula:

$$Al_{1-x}[X]_xAs$$

wherein:
X is at least one group III element other than Al;
x is greater than or equal to 0; and
x is less than or equal to 0.5.

12. The method of claim 11, wherein the epilayer is grown to have a mean thickness of less than 100 nm.

13. The method of claim 11, wherein growing the epilayer is done at a temperature below 500° C.

14. The method of claim 11, wherein the epilayer is AlAs.

15. The quantum dot laser of claim 8, wherein the mean thickness of the epilayer is less than 10 nm.

16. The quantum dot laser of claim 8, wherein X is Ga.

17. The quantum dot laser of claim 8, wherein the epilayer is AlAs.

18. The quantum dot laser of claim 8, wherein the at least one layer of III-V compound has a zinc blende crystal structure.

* * * * *